(12) United States Patent
Leung et al.

(10) Patent No.: US 7,456,621 B2
(45) Date of Patent: Nov. 25, 2008

(54) DIGITAL CONTROLLER BASED POWER FACTOR CORRECTION CIRCUIT

(75) Inventors: Ka Y. Leung, Austin, TX (US); Donald E. Alfano, Round Rock, TX (US); Ross Martin Fosler, Buda, TX (US)

(73) Assignee: Silicon Laboratories Inc., Austin, TX (US)

( * ) Notice: Subject to any disclaimer, the term of this patent is extended or adjusted under 35 U.S.C. 154(b) by 397 days.

(21) Appl. No.: 11/382,009

(22) Filed: May 5, 2006

(65) Prior Publication Data
US 2007/0036212 A1    Feb. 15, 2007

Related U.S. Application Data

(60) Provisional application No. 60/678,353, filed on May 6, 2005.

(51) Int. Cl.
*G05F 1/40* (2006.01)
(52) U.S. Cl. .......................... 323/283; 323/285; 363/39; 363/44

(58) Field of Classification Search ................. 323/222, 323/241, 283, 285, 322; 363/39, 41, 44
See application file for complete search history.

(56) References Cited

U.S. PATENT DOCUMENTS

| 6,175,272 | B1 * | 1/2001 | Takita | 330/10 |
| 6,448,745 | B1 * | 9/2002 | Killat | 323/222 |
| 6,791,305 | B2 * | 9/2004 | Imai et al. | 323/283 |
| 6,917,185 | B2 * | 7/2005 | Okamoto | 323/241 |

\* cited by examiner

*Primary Examiner*—Jessica Han
(74) *Attorney, Agent, or Firm*—Howison & Arnott, L.L.P.

(57) ABSTRACT

A power factor correction circuit utilizes a digital controller string comprised of an analog-to-digital converter, which is input to a digital compensator followed by a pulse width modulation circuit for generating a switching pulse. The loop current in a regulator circuit such as a boost regulator is sensed and input to one side of a differential analog-to-digital converter, the other side thereof providing a digital reference current. This digital reference current is derived from comparing the input AC voltage to the regulator with the DC output voltage and processing these two voltages with a PFC algorithm to provide this reference voltage.

13 Claims, 13 Drawing Sheets

DIGITAL CONTROLLER BASED POWER FACTOR CORRECTION CIRCUIT

CROSS-REFERENCE TO RELATED APPLICATIONS

This application claims priority in U.S. Provisional Patent Application Ser. No. 60/678,353 filed on May 6, 2005 entitled "DIGITAL CONTROLLER BASED POWER FACTOR CORRECTION CIRCUIT," which is incorporated in its entirety herein by reference.

TECHNICAL FIELD OF THE INVENTION

The present invention pertains in general to power factor controllers (PFC), and more particularly, to a power factor controller utilizing a digital control string.

BACKGROUND OF THE INVENTION

The term "power factor" is borrowed from elementary AC circuit theory. When a sinusoidal AC power source feeds either an inductive or a capacitive load, the load current is also sinusoidal but lags or leads the input voltage by some angle "x" for an rms input voltage $V_i$ and rms input current $I_i$, the "apparent power" taken from the lines is $V_i I_i$. However, the actual power delivered to the load is only $V_i I_i \cos(x)$ is only the component of input current which is in phase with the voltage across the load resistance ($I_i \cos(x)$) which contributes to the load power. The component of input current normal to the voltage across the load resistor ($I_i \sin(x)$) does not contribute to the actual load power. At one phase of the AC input wave form, it represents power drawn from the input source which is temporarily stored in the reactive component of the load device. In a later phase of the input voltage, this stored current or energy is returned to the input source. But this excessive current, which does not contribute to low power, wastes power in the winding resistance of the input power source and a resistance of the input power line. In AC power circuit jargon, the magnitude of $\cos(x)$ is referred to as the "power factor." It is desirable to keep the power factor as close to unity as possible, i.e., to keep the input line current sinusoidal and in phase with the sinusoidal input line voltage. The means to achieve is referred to as "power factor correction" (PFC).

In the field of switching regulators, any circuit configuration which causes input line current to be non-sinusoidal or even sinusoidal but out of phase with the sinusoidal input voltage or to have harmonics of the line voltage results in a lowered power factor and consequent waste of the power.

To date, most power factor correction circuits utilize fully analog components to realize the correction algorithms and energy is switched to the load in such a manner as to maintain an in phase condition so as to maximize or "correct" the power factor and in such a manner as to minimize line harmonics.

SUMMARY OF THE INVENTION

The present invention disclosed and claimed herein, in one aspect thereof, comprises a power factor correction circuit. A power factor correction circuit utilizes a digital controller string comprised of an analog-to-digital converter, which is input to a digital compensator followed by a pulse width modulation circuit for generating a switching pulse. The loop current in a regulator circuit such as a boost regulator is sensed and input to one side of a differential analog-to-digital converter, the other side thereof providing a digital reference current. This digital reference current is derived from comparing the input AC voltage to the regulator with the DC output voltage and processing these two voltages with a PFC algorithm to provide this reference voltage.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
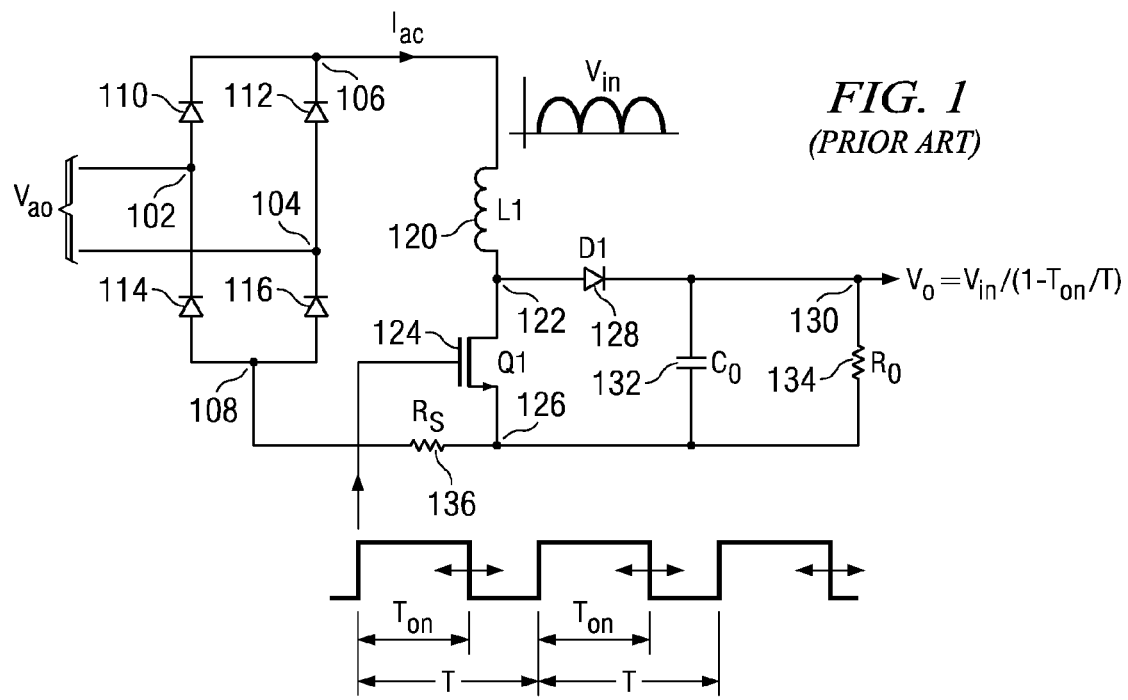
FIG. 1 illustrates a prior art boost regulator with power factor correction.

Referring now to FIG. 1, there is illustrated a prior art boost regulator with power factor correction (PFC). A full wave rectifier is provided between two input nodes 102 and 104 that receive an AC voltage and provide a rectified voltage between two nodes 106 and 108, node 106 being the $V_{IN}$ voltage which has a current $I_{ac}$ associated therewith. A first diode 110 is connected between node 102 to node 106 and a second diode 112 is connected between node 104 and 106, diodes 110 and 112 having the cathodes thereof connected to node 106. Similarly, a diode 114 is connected between node 102 and node 108 and a diode 116 is connected between node 104 and 108, the cathodes of diodes 114 and 116 connected to respective nodes 102 and 104. The voltage at node 106 is a rectified voltage that has an input zero crossing. These are half sinusoids that are then operable to drive a continuous-mode boost converter. This converter is comprised of an inductor 120 connected between node 106 and a node 122, a switching transistor 124 connected to the node 122 and a node 126 and a diode 128 having the anode thereof connected to node 122 and the cathode thereof connected to an output node 130. An output load capacitor 132 is connected between node 130 and node 126 and a load resistor 134 is connected between node 130 and node 126. A sense resistor 136 is connected to a node 126 and node 108 and has a value of $R_s$.

The first task of the power factor correction circuit is to use the boost converter to convert the varying input voltage up and down the half sinusoids to a constant, fairly well-regulated DC voltage somewhat higher than the input sine wave peak. This is the purpose of the boost converter. The boost converter boosts the low voltage to a higher voltage by turning on transistor 124 for a time $T_{on}$ out of a period T and storing energy in the inductor 120. When the transistor 124 turns off, the polarity across inductor 120 reverses, and the one end of the inductor 120 rises to a voltage ($V_o$) higher than the input voltage $V_{in}$. Energy stored in inductor 120 during $T_{on}$ is transferred via diode 128 to the load on node 130 during the time that transistor 124 is off. It can be shown that the output-input voltage relation of such a boost converter under continuous conduction is given by:

$$V_o = \frac{V_{in}}{1 - \frac{T_{on}}{T}}$$

It is noted that the equation for discontinuous conduction will be different.

The on time of transistor 124 is width-modulated in accordance with the above equation to yield a constant DC voltage $V_o$ somewhat higher than the peak of the input voltage sine wave. The on time through the sinusoidal half periods is controlled by a PFC control chip which senses the output voltage $V_o$, compares it to an internal reference in a DC voltage error amplifier, and in a negative feedback loop sets $T_{on}$ to keep $V_o$ constant at the selected value.

Figure 2:
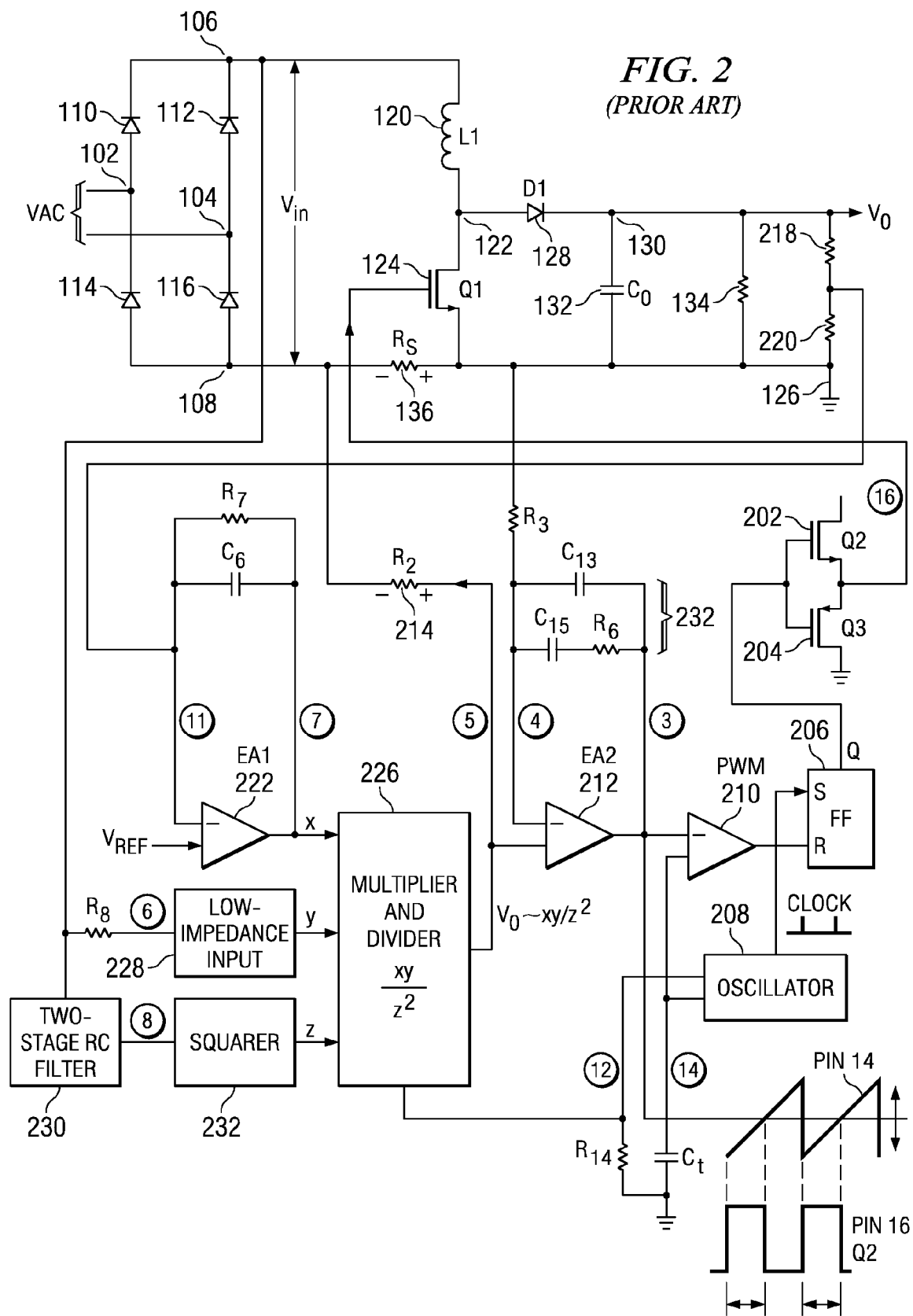
FIG. 2 illustrates a more detailed diagram of a prior art PFC circuit.

Referring now to FIG. 2, there is illustrated a more detailed diagram of the PFC circuit and the controller chip. This is an analog controller chip, manufactured by Unitrode, part No. UC 3854. The transistor 124 is controlled by totem pole output drivers comprised of transistors 202 and 204, which are controlled by the output of a flip-flop 206 which has the set input thereof controlled by a saw-toothed oscillator 208 that operates at a frequency $F_s = 1.25/(R_{14}C_T)$. When the flip-flop 206 is set by a narrow spike at the start of each saw-tooth from the oscillator 208, an on time commences. The end of the on time occurs when flip-flop 206 is reset by a pulse width modulator circuit 210 at the instant the saw-tooth at its non-inverting input terminal crosses the DC voltage level at the output of a linear current amplifier 212. This amplifier 212 provided the output thereof a non-inverted, amplified version of the instantaneous difference between a voltage drop across the series resistance 136 and voltage rise across a series resistor 214 connected between node 108 and one input of the amplifier 212. The output voltage is sensed with a resistor divider comprised of resistors 218 and 220 and input to the input of a difference amplifier 222, which determines the difference between the output voltage and a reference voltage $V_{REF}$. A compensation circuit comprised of the parallel resistor and capacitor is connected between the input connected to the resistor divider and the output amplifier 222. This comprises a value "x." This is input to a multiplier and divider circuit. The input voltage at node 106, half sinusoidal input, is input to a low impedance input circuit 228, the output thereof comprising a "y" input to the multiplier and divider circuit 226. The RMS value of the input voltage is provided by passing the input voltage on node 106 through an RC filter 230 and a squarer circuit 232. This provides the "z" input to the multiplier and divider circuit 226. The multiplier and divider circuit 226 is operable to determine the value $xy/z^2$ to provide an output therefrom. This output is then input to the linear amplifier 212 which is operable to compare the output with the sensed current across resistor 136. This is then digitally compensated with a digital compensator 232 and then input to the PWM 210. Again, this is a conventional analog implementation of a conventional PFC algorithm.

Figure 3:
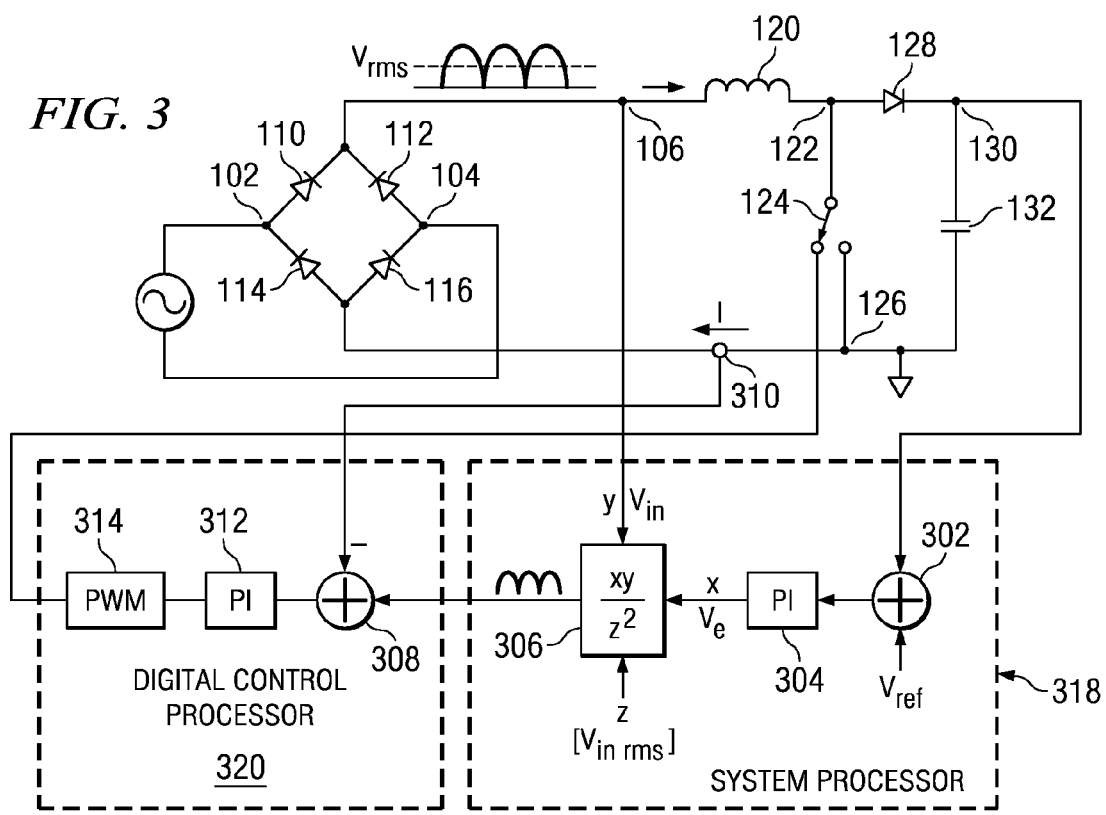
FIG. 3 illustrates a logic diagram of the prior art system utilizing the invention to realize a portion thereof

Referring now to FIG. 3, there is illustrated a block diagram of the algorithm of the embodiment of FIG. 2 illustrating a portion thereof that is implemented in a processor based system and a portion thereof that is implemented in a digital controller. However, it should be understood that the block diagram of FIG. 3 is a general block diagram that represents the operation of the prior art system of FIG. 2, noting that the prior art system of FIG. 2 is implemented completely within an analog environment. The output of the circuit, the DC output on node 130, is input to a difference circuit 302 to determine the difference between the DC output voltage and a reference voltage, this correlating to the amplifier 222 of FIG. 2. This then passes through a compensator 304 for providing compensation on a proportional-integral bases, this being well know. This provides an error voltage YE which comprises the "x" input to multiplier divider block 306. This receives the rms value of the input voltage as the "z" value and the input voltage YIN as the "y" voltage from the node 106. The output of the multiplier/divide block 306 is input to a subtraction block 308 which subtracts this value calculated thereby from a voltage corresponding to the current through node 126 and diodes 114 and 116. This is determined with the use of Hall sensor 310, a conventional device. The output of the subtraction block 308 provides a difference voltage which is input to a digital compensator 312, the output thereof processed by a pulse width modulator 314 to provide control signals to the switch 124. In accordance with the present disclosed embodiment, the operations represented by the blocks 302, 304 and 306 are implemented in a system processor, system processor 318, which is an instruction based system. The output of value determined thereby then provides a reference voltage to an analog-digital converter that is used to realize the operation of the subtraction block 308. The block 308, block 312 and PWM block 314 are all implemented with the use of a digital control processor 320, such that a hardware based implementation is provided for these three blocks.

Figure 4:
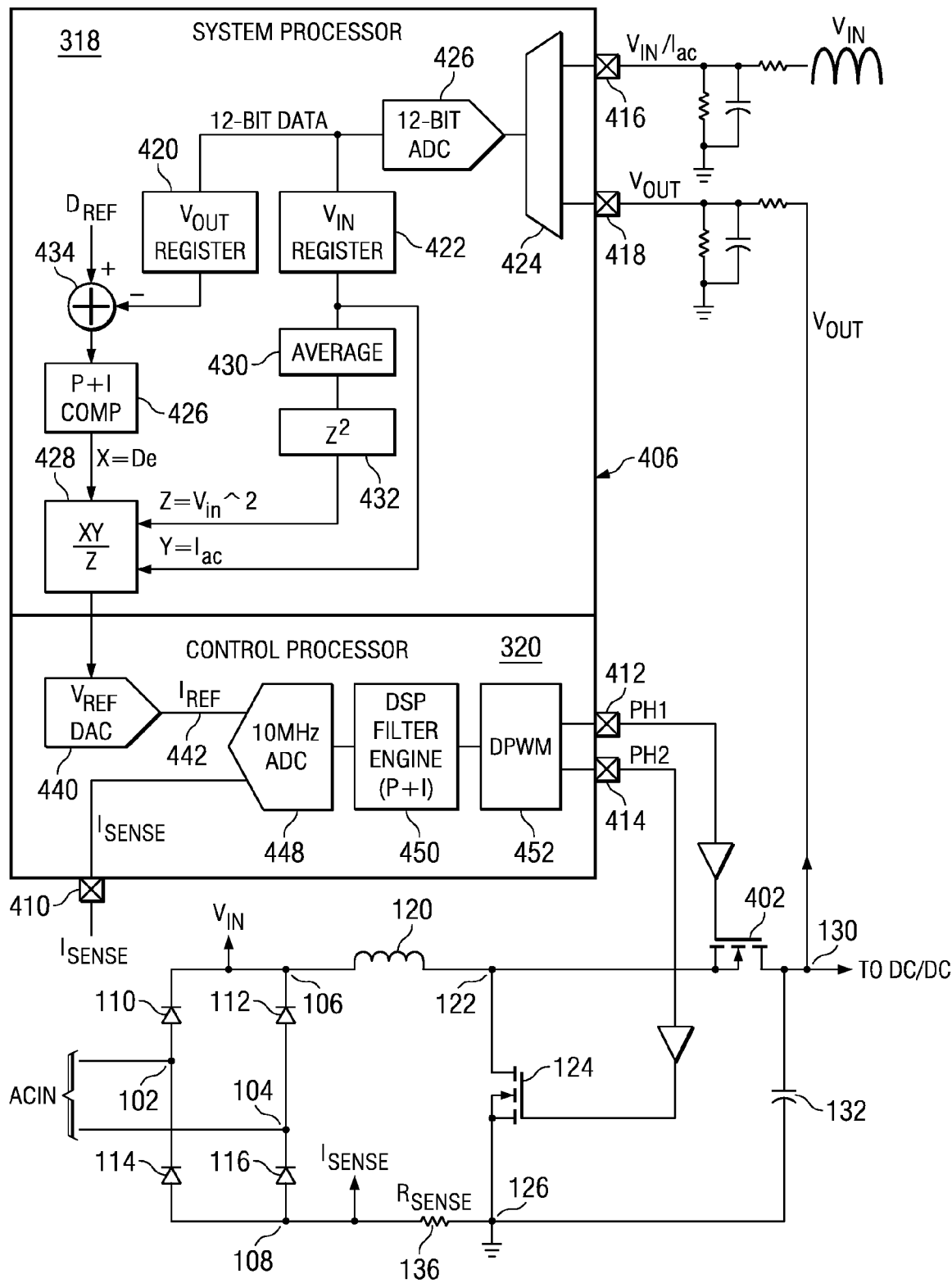
FIG. 4 illustrates a block diagram of the PFC chip interfaced with a regulator circuit.

Referring now to FIG. 4, there is illustrated a more detailed block diagram of the processor chip as interfaced with the boost regulator. In this embodiment, there is provided an additional switch between node 122 and node 130, this additional switch being a transistor 402 that replaces diode 128. Therefore, the transistor 124 and the transistor 402 are both controlled by two different pulse width modulated signals from an integrated circuit 406. The current is sensed on node 108, this being the current through resistor 136 that provides the voltage representing the current. This is input to one terminal 410 on an integrated circuit 406. There are provided two output terminals 412 and 414 connected to the gates of transistors 402 and 124, respectively, providing the control voltages. The output voltage $V_{OUT}$ is connected to one side of a divider circuit and into an input terminal 418. The input voltage on node 106 is connected to an input terminal 416 through a divide circuit also. Therefore, the only inputs to the integrated circuit from the regulator are the $V_{IN}$ voltage, the $V_{OUT}$ voltage and the current sense with the outputs being the control the width modulated control pulses.

As noted hereinabove, the integrated circuit 406 is divided into a system processor section 318 and a digital control processor section 320. The portions of the system processor are a multiplexer 424 that multiplexes the terminals 418 and 416 to the input of an analog-to-digital converter 426 for operation thereon. The values are sampled and then the voltage on terminal 418 is stored in a $V_{OUT}$ register 420 and the sample value of the voltage on terminal 416 is stored in a $V_{IN}$ register 422. This output value stored in register 420 is then subtracted from a digital reference voltage with a subtraction circuit 434 and then a proportional-integral digital compensation algorithm is applied thereto at a block 426 to divide the "x" value to the input of the divide/multiplier block 428. The $V_{IN}$ register 422 holds the value of $V_{IN}$ which is then provided as one input to the block 428 as the "y" value with the rms value of the YIN value provided by passing the YIN value through an average block 430 and then a squarer block 432. This provides the "z" value as noted hereinabove. This then provides the digital value representing the $I_{REF}$ value. This is input to the digital control processor 320.

The digital control processor 320 includes a reference digital-to-analog converter 440 that converts the output thereof to an analog voltage on a line 442 for input to a flash analog-to-digital converter 448, a high speed ADC. The other input is connected to terminal 410. The output of the ADC 448 is then input to a Digital Signal Processor (DSP) filter engine 450 to provide the digital compensation. This is, in the present embodiment, referred to as a PID digital compensator. This is then input to a digital pulse width modulator (DPWM) circuit 452. The output thereof provides the two phase output values on terminals 412 and 414. Therefore, it can be seen that an instruction based processor is utilized to perform the first portion of the PFC algorithm whereas the actual control portion for generating the output pulse width-modulated pulses based upon the sensed current and an instruction-based generated reference current will provide a relatively fast control loop.

Figure 5:
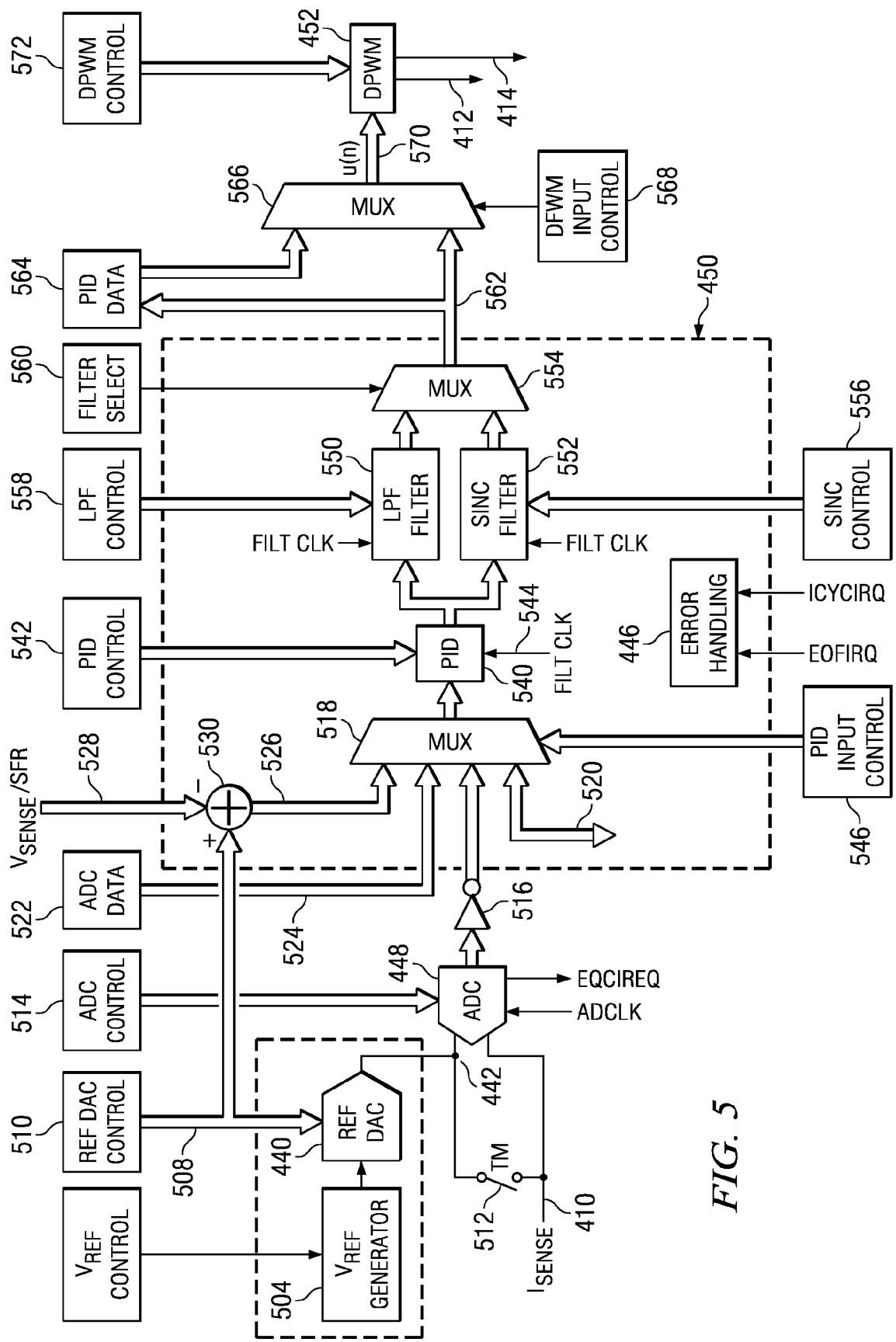
FIG. 5 illustrates a block diagram of the digital control section.

Referring now to FIG. 5, there is illustrated a more detailed block diagram of the digital control processor block 320. The ADC 448 is a differential Flash ADC that is operable to determine as a digital value the difference between the voltage on the node 108, that being the $I_{SENSE}$ voltage, and a reference voltage on node 442. This analog reference voltage on node 442 is generated by the DAC 440. An analog reference voltage generator 504 is operable to generate a fixed analog reference voltage based on an internal reference such as a bandgap generator. The bandgap generator is a conventional circuit that is utilized to generate temperature and process stable voltages. This is not shown in the illustration of FIG. 5. This reference voltage is provided as a reference input to the reference DAC 440. This is a scaling DAC that is operable to receive a digital word on a bus 508 from a reference DAC control block 510 that is controlled by a microcontroller (described hereinbelow). This is basically a register that can be written to for the purpose of generating the reference DAC voltage. The reference DAC 440 is operable to convert this digital value on bus 508 to an analog voltage on node 442 for input to one of the differential inputs of the ADC 448. Typically, the voltage generated by generator 504 is a 1.25 V analog voltage. The output of the reference DAC 440 comprises the reference current determined by the system processor 318. The reference voltage on node 442 is compared with the $I_{SENSE}$ voltage on node 410 and, when power factor corrected, this should essentially be zero. In the test mode of operation, there is provided a switch 512 which is operable to short the two inputs together. This will be described hereinbelow.

The ADC 448 is a parallel ADC of the Flash type. It is a window ADC that is operable to generate a zero voltage output when the differential input is "0." An ADC control block 514 is operable to provide a control input to the ADC 448. The control block 514 provides a variable LSB input to the ADC 448 for use with some of various features thereof. The ADC operates on an ADC CK clock signal and also generates an end of conversion cycle interrupt, EOC1 IRQ. This provides an indication of when a data conversion operation is complete on a given sample and digital data associated with the analog sample is ready to be output. The data is output through an inverter circuit 516 for input to one input of a 4-input digital multiplexer 518, which is part of the input interface to the digital compensator 450.

The digital compensator 450, in addition to receiving the output of the ADC 448 through the inverter 516, is also operable to receive a ground input on a digital input bus 520, ADC data from a register 522 through a bus 524 for digitally generated ADC data, primarily for test purposes.

The output of the multiplexer 518 is input to a PID controller block 540, which provides a proportional, integral, derivative (PID) control algorithm. This PID block 540 provides loop stability without sacrificing bandwidth and improves the loop's transient response. The proportional and derivative control blocks introduce compensation zeros. There is provided a PID control block 542 that controls the operation of the PID 540 by providing gain constants for the operation thereof. The operation is clocked with a filter clock, FILTCLK, on a clock input 544. The input to the PID 540 is determined by the output of multiplexer 518, which is controlled by a PID input control block 546. The clock rate is around 10 MHz, wherein the switching frequency of the power supply is around 500 kHz The analog corollary to the digital controller has one inherent benefit in that the overall operation of the analog controller has an inherent low pass filter function associated therewith. The PID 540, on the other hand, has an amplitude and phase response that increases with increasing frequency such that the gain thereof becomes relatively high at higher frequencies and the phase also increases in an ever increasing phase leading manner. To accommodate the frequency response of the PID, post processing filtering is required. This is facilitated in the present embodiment with either a low pass filter, represented by an LPF filter block 550 or a sinc filter block 552. The output of the PID 540 is input to both of these blocks 550 and 552 and the outputs thereof selected with a two-input digital multiplexer 554. The sinc filter operation 552 provides for a plurality of "notches" which are controlled by a sinc control block 556, the sinc filter block 552 clocked by the FILTCLK clock signal. The LPF filter block 550 also utilizes variable poles and zeros that are set by an LPF control block 558. The LPF filter block 550 is also clocked by the filter clock, FILTCLK. The output of multiplexer 554 provides the output from the digital compensator 450, the output selected by the multiplexer 554 controlled by a filter select block 560.

The output of the multiplexer 554 from the digital compensator 450 is provided on a digital data bus 562. This is input to a PID data register 564 for the purpose of monitoring the operation thereof, such that the output of the digital compensator block 450 can be monitored. The output of the multiplexer 554 is also input to the input of a two-input digital multiplexer 566, the other input thereof receiving data from the PID data block 564, such that the operation of the compensator 450 can be bypassed. The multiplexer 566 is controlled by a DPWM input control block 568. The output of the multiplexer 566 provides the u(n) error signal, which is output on a bus 570 to the DPWM 452. The DPWM 452 is a state machine and is controlled by a DPWM control block 572. The DPWM block is operable to receive various control signals from the DPWM control block 572 from the microcontroller and is also operable to generate a plurality of interrupts (not shown) and receive various interrupts. For example, at the end of a given frame, there will be an EOFIRQ interrupt generated, and the DPWM 452 will also receive various interrupts from the error handling block 446 to indicate either over current situations or over voltage situations.

Figure 6A:
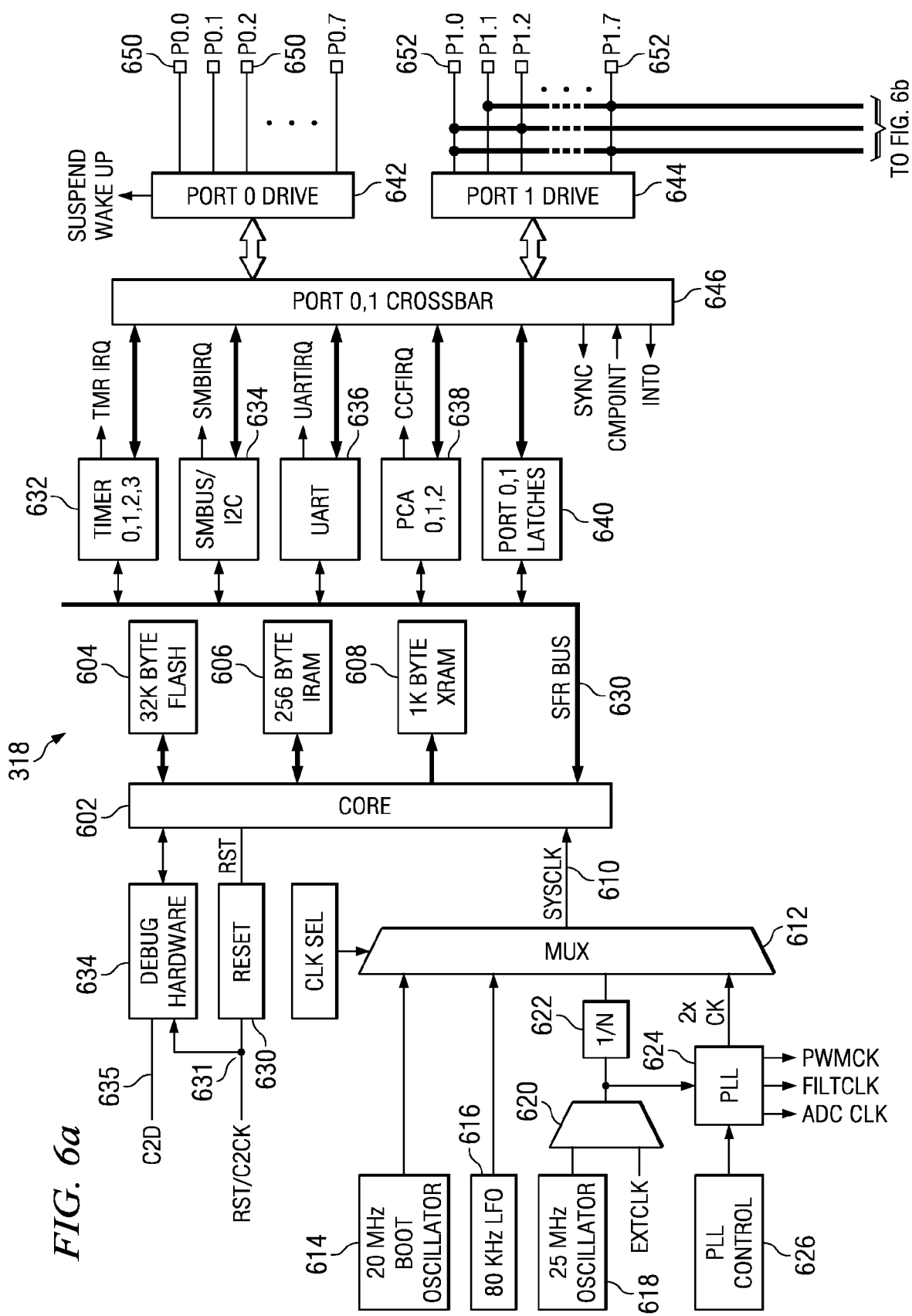
FIGS. 6a and 6b illustrate a block diagram of the system processor.
Figure 6B:
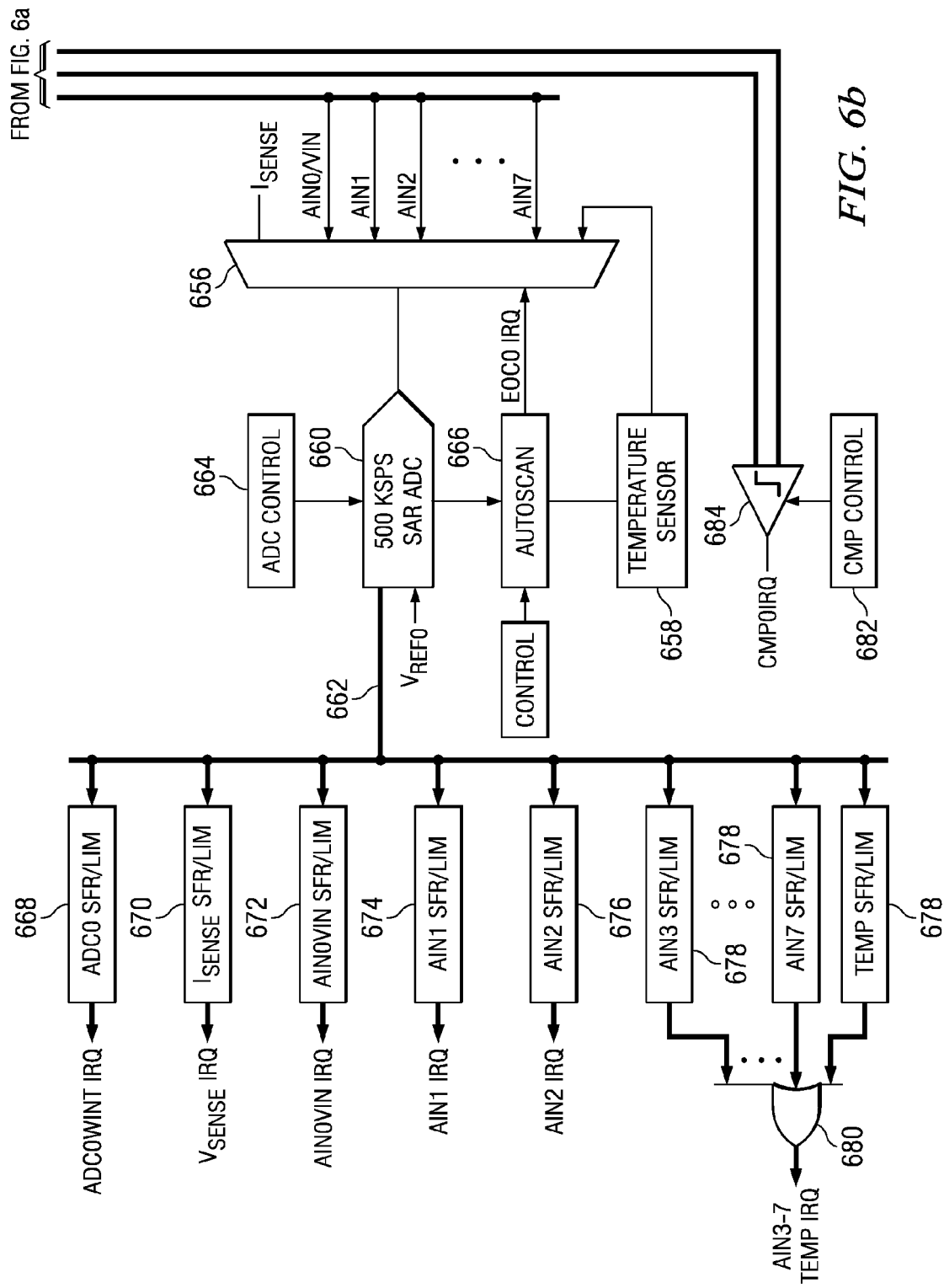

Referring now to FIGS. 6a and 6b, there is illustrated a detailed block diagram of the microcontroller that represents the system controller 318. This microcontroller is an 8051 instruction-based engine which is substantially disclosed in U.S. patent application Ser. No.10/244,344, filed on Sep. 16, 2002 and entitled "Precision Oscillator for an Asynchronous Transmission System," which is incorporated herein in its entirety by reference for all purposes whatsoever. At the center of the microcontroller is a processing core 602 which is an 8051 microprocessor engine. This is an instruction-based engine. There is provided a 32K byte Flash memory block 604, 256 byte IRAM block 606 and a 1K byte XRAM block 608, providing memory for the processing core 602. Clock signals are provided to the core 602 in the form of a system clock, SYSCLK, on a clock line 610. This is provided on the output of a multiplexer 612. The multiplexer is operable to receive the input thereof from a 20 MHz boot oscillator block 614, an input from an 80 kHz low frequency oscillator block 616 to provide an 80 kHz clock for use in a sleep mode, or a higher frequency clock in the form of a divided down 25 MHz oscillator 618. The 25 MHz oscillator is the primary oscillator at the operating frequency of the core 602, as the core 602 operates at high frequency or at low frequency. However, at low frequency, the processing of instructions occurs at a much slower rate and this mode is typically used in a sleep mode. In the normal operating mode, typically the higher frequency clock oscillator is utilized. This clock is a non-crystal based clock and has an accuracy of approximately 2%. The output of the clock 618 is input through a two-input multiplexer 620 to the multiplexer 612, the output of multiplexer 620 passed through a divide block 622 in order to divide the frequency of the clock, if necessary. Additionally, an external clock is input to the other input of multiplexer 620, such that either the internally generated 25 MHz clock can be utilized or an external clock can be utilized. A phase lock loop 624 is provided which is controlled by a PLL control block 626 and this utilizes the 25 MHz clock 618 as a reference and then multiplies this clock up to as high as 400 kHz. This provides an output to one end of the multiplexer 612 for selection as the SYSCLK. This PLL 624 is operable to generate the other clocks associated with the operation of a digital controller, the clock for the DPWM 452, PWMCK, the filter clock, FILT-CLK, and the ADC clock, ADCCLK. This will be described hereinbelow.

The core 602 is also operable to receive a Reset signal on a block 630, which is operable to generate a reset when it is not in a debug operating mode. In a debug operating mode, the Reset input on a node 631 is input to the clock input of a debug hardware block 634 to provide a clock signal thereto, the other input being a serial data input on a line 635. This is a two-wire serial data port that allows for very low clocked data to be input to the core 602 during a debug mode. In the reset mode, the reset block 630 provides the reset signal to the core 602.

The core 602 is interfaced through a special function register (SFR) bus 630 to various I/O blocks. In the embodiment illustrated herein, four timers 632 are provided. Each of these timers is operable to have the parameters thereof set, and initiated and each of them generates various timer interrupts, TMRXX IRQ, signals. Additionally, there are provided a number of serial bus configurations for allowing for various formats of a serial data interface. One of these is the SM Bus/I2C format, in a block 634. This is a conventional serial data format. Additionally, there is provided a UART functionality in a block 636. There is provided a programmable counter/timer array (PCA) block 638 and a plurality of port latches 640 for interfacing with a port "0" block 642 and a port "1" block 644 for transmitting and receiving data therefrom. All of the blocks 632-640 are interfaced through a crossbar matrix block 646, which is disclosed in U.S. Pat. No. 6,738,858, issued May 18, 2004, which is incorporated herein by reference. The crossbar matrix is operable to selectively connect any of the outputs of the blocks 632-640 to any of a plurality of output pins associated with the port driver 642 and 644, there being eight pins 650 associated with the port "0" driver 642 and eight pins 652 associated with the port "1" driver. These pins can function as digital outputs, digital inputs or analog inputs.

For analog sensing, all of the eight pins 652 associated with the port "1" driver are connectable to analog inputs of a multiple input analog multiplexer 656, representing the multiplexer 424, which is operable to receive eight analog inputs, AIN0, AIN1, . . ., AIN7, an $I_{SENSE}$ input and a Temperature input. The input voltage $V_{IN}$ is connected to the AIN0 input for sensing thereof. A separate dedicated pin is provided for the $T_{SENSE}$ input for input to the multiplexer 656. An additional input is provided by an internal temperature sensor 658, which senses the chip temperature, which basically constitutes the environmental temperature, this being an input to the analog multiplexer 656. The output of the analog multiplexer 656 is input to the input of a 12-bit SAR ADC 660, representing the ADC 426, operating at a sampling clock of 500 Ksps. This is a single-ended ADC that provides the digital output on a bus 662. The control for the ADC 660 is provided by the ADC control block 664. The analog multiplexer 656 is controlled by an auto scan block 666, which is operable to scan through all of the inputs in a cyclical manner. At the end of each conversion cycle, there is generated an interrupt EOC0 IRQ indicating the end of the conversion cycle for the ADC 66. This is input to the auto scan block 666 which will then increment the select control on the multiplexer to the next input to initiate a second or subsequent conversion operation. For each scan step, the output of the ADC 660 is "steered" or directed toward an associated special function register (SFR)/limiter (LIM). Each of these SFR/LIM blocks is operable to store the associated output, compare it with an internal fixed upper and/or lower limit, which can be varied upon power-up, and then output an interrupt if it exceeds the limit(s). In the first five SFR/LIMs, there is provided an ADC window interrupt in an SFR/LIM block 668, an SFR/LIM block for the $I_{SENSE}$ output 670, an SFR/LIM block 672 for the AIN0 output, an SFR/LIM block 674 for the AIN1 input, and an SFR/LIM block 676 for the AIN2 input. Each of these blocks 668- 676 provide an associated interrupt, ADC0WTNTIRQ, VSENSE IRQ, AIN0VTN IRQ, AIN1 IRQ, and AIN2 IRQ. Since the core 602 can only handle a certain number of interrupts, the remaining inputs, AIN3-AIN7 and TEMP are associated with respective SFR/LIM blocks 678. The output of each block 678 provides an associated interrupt to an OR gate 680. The output of the OR gate 680 provides an interrupt, which when recognized by the core 602, requires that the core 602 then "poll" the outputs of the SFR/LIM blocks 678, it being recognized that each of the SFR/LIM blocks occupies a unique address in the address space of the core 602, such that the contents thereof can be read, or in certain circumstances, written to. Whenever an interrupt is generated, the core 602 initiates an interrupt sub-routine for servicing that particular interrupt, as is the case with any interrupt generated.

There is also provided a comparator function for generating a comparator interrupt. A comparator block 684 is provided which is operable to have one compare input interface with the even ones of the pin 652 and a second input interface with the odd inputs thereto. This is a four comparator block, which is controlled by a comparator control block 682 and will generate a comparator interrupt whenever any of the respective inputs exceeds the threshold set therein.

In general, the digital control processor 320 of FIG. 5 and system processor Figs. 6a and 6b are described in detail in U.S. patent application Ser. No. 11/096,597, filed Apr. 31, 2005, and entitled "Digital PWM Controller," which application is incorporated herein by reference in its entirety for any purpose whatsoever.

Figure 7:
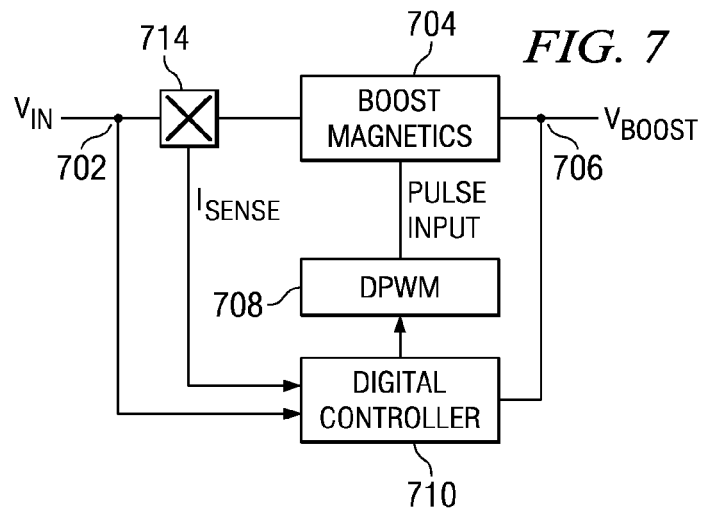
FIG. 7 illustrates a diagrammatic block diagram of an overall boost converter for receiving input voltage and boosting it to a higher output voltage with a digital controller for controlling the power factor correction.

Referring now to FIG. 7, there is illustrated a block diagram of a boost converter utilizing the digital power factor controller (PFC) of the present disclosure in one embodiment thereof. An input voltage is received on an input 702 that is input to a block 704 which represents the magnetics, this being the transformers, diodes, etc., that are associated with any type of boost converter. This is a switching magnetic system that requires input pulses to be received that control the switching times of the internal drive transistors (not shown). This is the conventional boost converter that operates in a DC/DC switched mode. This provides on the output thereof a boost voltage at an output node 706. A pulse signal is received on a pulse input from a digital pulse width modulator (PWM) 708. This is controlled as a part of a digital controller 710. The digital controller 710 is operable to receive as inputs the input voltage from node 702, the output voltage from node 706 and a sensed input current output from a current sensor 714. This sensor 714 could be, for example, a Hall Effect sensor or any other type of current sensor that determines voltage, even a series resistor where the voltage there across represents the current. By utilizing the input voltage, the output voltage and the input current, power factor correction can be effected, as will be described hereinbelow in this embodiment.

Figure 8:
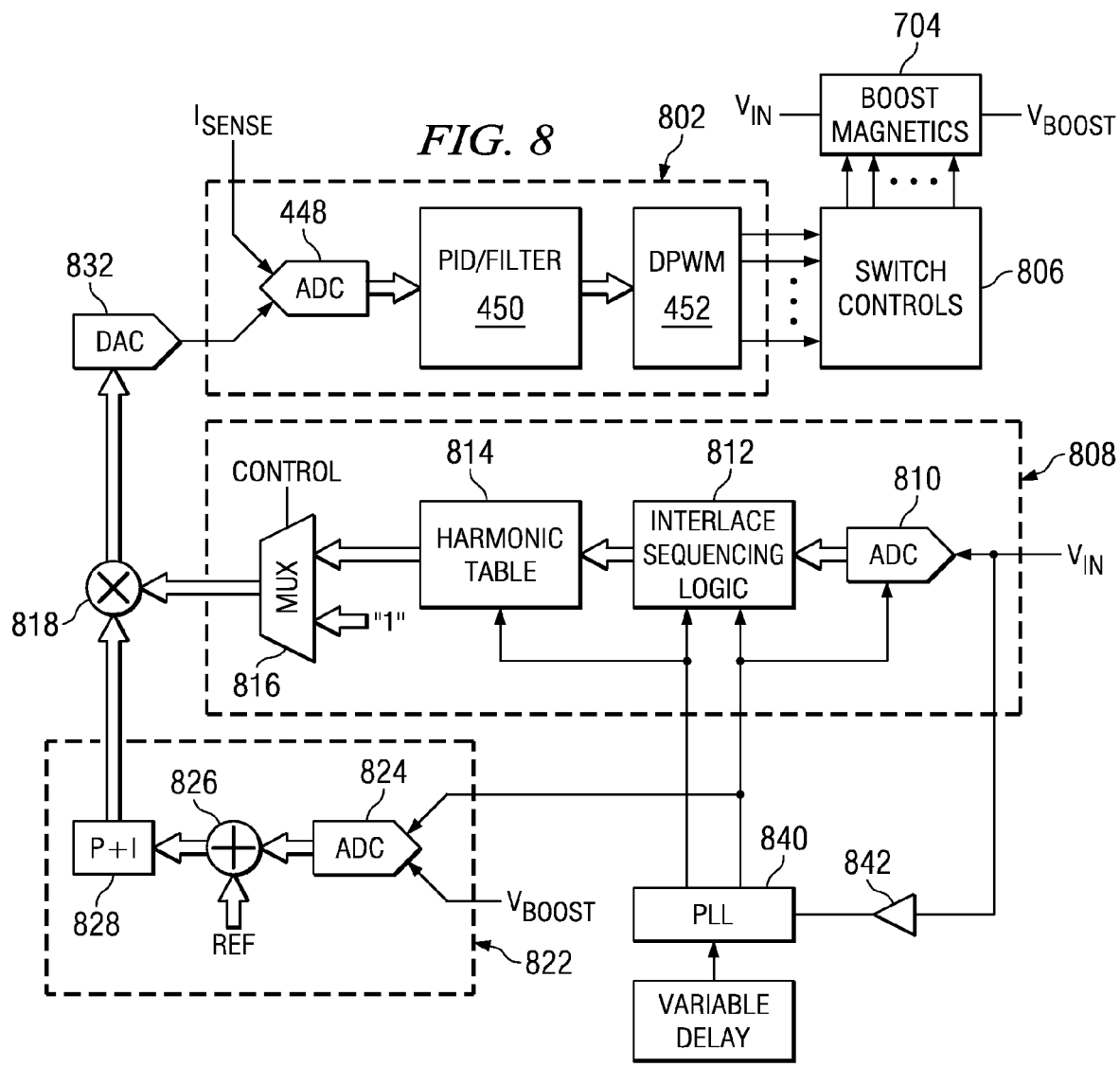
FIG. 8 illustrates the block diagram of a power factor controller utilizing the harmonic table.

Referring now to FIG. 8, there is illustrated a block diagram of one embodiment of the power factor controller. In this embodiment, there is provided a high speed average current mode control loop 802 that is essentially comprised of the high speed Flash ADC 448, the PID digital compensator 450 and the DPWM 452 illustrated in FIG. 4. This receives on one input of the ADC 448 the sensed current, which is controlled by a moving reference on the other input thereto that follows a predicted harmonic content. The output of the DPWM is input to a switch controller 806 that is operable to generate pulse control signals to the boost magnetics block 704.

A harmonic predictor block 808 is provided that is operable to capture the harmonic content of the input voltage at a much slower sampling rate and output a predicted waveform at a higher rate to track the input voltage and, thus, the current, since the current and voltage track each other. The harmonic predictor is operable to sample the input voltage with an ADC 810, the output thereof which is only sampled a predetermined number of times for each half cycle of the input voltage. By utilizing an interlaced sequencing logic block 812, successive cycles of the input voltage can be sampled at different times therein to create a harmonic table 814 for storage of the harmonic information therein. This sampling operation occurs at a rate much slower than the rate of the output waveform. This harmonic table is then utilized, after it is built, to create a predicted input signal that represents the average of the harmonics of the input signal from the actual input signal over a given cycle of the input voltage. This creation of a harmonic table is an operation that can be achieved by averaging data sampled at the same relative position with data from a previous sampled half sinusoid. This allows the table to be constantly updated based upon the input samples. Since the input samples are taken over only one or two points in a given half sinusoid, this results in a very low speed loop to create the harmonic table. The output of the harmonic predictor, however, operates at a much higher bandwidth that the sampling operation thereof to track the input voltage. This output of the harmonic predictor is input through a multiplexer 816 to the input of the multiplication block 818. Further, when the system initially starts up, the harmonic table 814 requires a predetermined amount of time to build up and, during that time, a logic value of "1" (or a filtered version of the input voltage) is input to the multiplexer 816 and this is selected for output to the multiplication block 818. This will be described in more detail hereinbelow.

The harmonic predictor block 808 samples the input voltage on a schedule that is sent by the interlaced sequencing logic block 812. Through this schedule, a profile of the moving input voltage, $V_{IN}$, is built as a stored table in the harmonic table block 814. This is typically an on board RAM. However, it could be stored in flash memory also. This is utilized for the current reference. By interlacing the samples, this particular harmonic predictor block 808 can operate at a much lower sampling rate on the input to create the prediction in order to allow the block 808 to operate at a lower bandwidth. In the disclosed embodiment, the block 808 is realized with the MCU and the processing core therein, and utilizing the low sampling rate frees up processing time and further allows the use of a slow ADC that can be different than the ADC 448 in the digital controller, thus providing for a less complex circuit which translates to less silicon space and a lower cost.

The output voltage is also sampled through a very slow loop to provide a reference or scaling factor. This is illustrated by the loop 822. The output voltage, the boost voltage, $V_{BOOST}$, is input to an ADC 824, the output thereof input to a summer 826. The output of the summer 826 represents the difference between the measured output voltage and a reference or desired voltage input to one input thereof. The output of the summer 826 is an error voltage that is input to a PI filter 828 which is comprised of the proportional and integration circuit, very similar to the PID 450 with the exception of not having to differentiate. It should be understood that this filter 828 could be any type of compensator. The output of the filter 828 is output to the other input of a multiplication block 818. The output of multiplication block provides the product of the recreated input voltage and the filtered output voltage. As such, the predicted harmonic content of the input voltage is therefore scaled by the output voltage. This is input to a DAC 832 to provide the reference input to the ADC 448. Therefore, the reference output from the DAC 832 is utilized to compare against the actual current to adjust both for phase and amplitude to both track the harmonics and to adjust the phase. Since the loop 802 is the high speed loop, this control can be effected at a high enough speed to control the switching operation. The building of the harmonic table does not have to be performed at the rate of the high speed loop. Once the harmonic table is built, it is then output under control of the processor at the rate of the input voltage such that it tracks the harmonics of the input voltage. In general, the control of the harmonic table and the output thereof and the interlaced sequencing logic 812 is all performed with the processing core 602. The harmonic content from the harmonic table 814 when mixed with the output feedback essentially sets the control current wave form, or the control reference.

The interlace sequence logic is controlled with a phase lock loop (PLL) 840 which is synchronized with the input voltage through a buffer 842. This is basically a software PLL, but it could be realized in hardware also. The PLL provides one signal to synchronize the period of the signal, it being noted that the input voltage is a half wave rectified signal, such that every "0" will result in a pulse or edge output from the PLL 840. PLL 840 also outputs a plurality of pulses over one period of the input voltage sinusoid at predetermined arrows. For example, the half sinusoid could be divided into 256 equal time segments such that the interlace sequencing logic 812 can select one or more of these during which to sample, i.e., they initiate a data conversion cycle. The pulse output is utilized to control the sampling operation of both the ADC 810 for sampling the input voltage and to provide the interlace sequencing logic 812 with the sample pulses from which to choose, and also control the sampling operation of the ADC 824.

The PLL is basically a timing function that initiates a timer to count between rising edges on either a digital input or an analog input. By determining the number of counts between two null in the half sinusoid, and the beginning of a null, it is then possible to generate samples at any of a plurality of discrete samples over the half sinusoid. Further, there is an internal delay provided that corrects for the detected zero crossing verses the actual zero crossing. Since the input DC voltage has ripple thereon that is derived from the output of a full wave bridge, it is a half sinusoid rectified signal. Thus, there appears only nulls at the zero crossings of the original input sinusoid. These nulls are what are detected. If the detection threshold is too high, then the detected null is delayed from the actual null and this can be corrected for with this delay.

Figure 9:
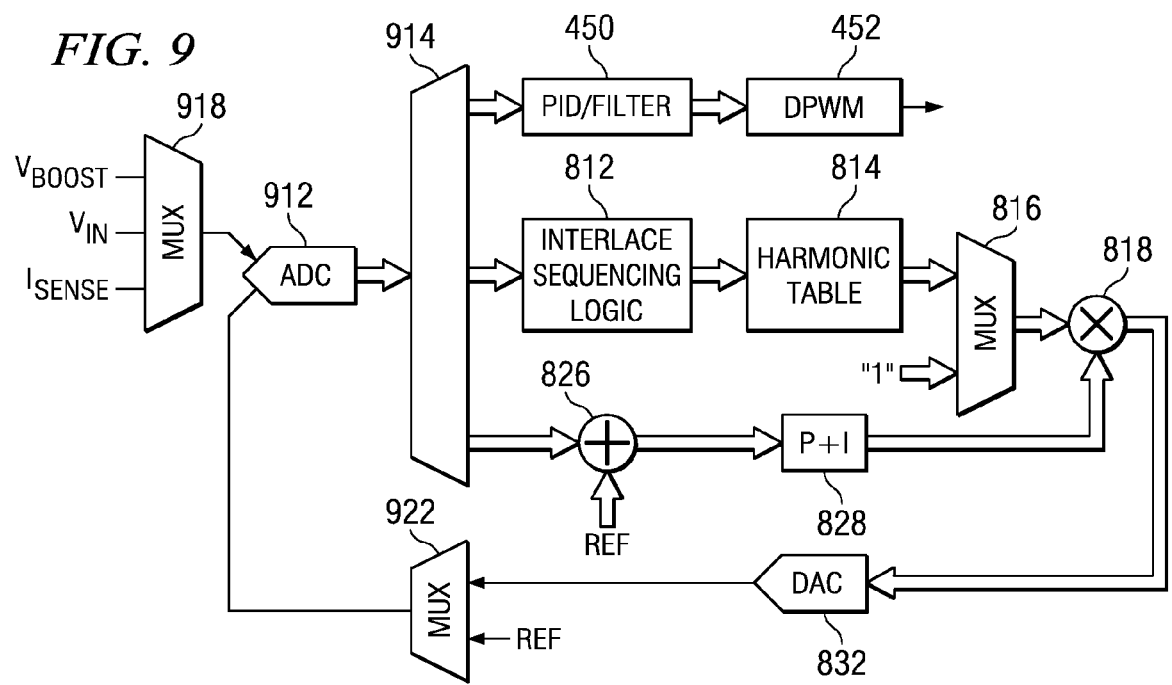
FIG. 9 illustrates an alternate embodiment of FIG. 8 with a multiplexed data converter.

Referring now to FIG. 9, there is illustrated an alternate embodiment wherein a single ADC 912 is provided that is multiplexed to provide the operation of the ADC 810, the ADC 824 and the ADC 848. This ADC has the output thereof multiplexed will the multiplexer 914, a one to three digital multiplexer that receives as inputs the output of the filter 450 in the high speed loop, the interlace sequencing logic 812 in the harmonic predictor 808 and the output of voltage regulator block 822. The input of the ADC 912 is connected through a multiplexer 918 to either the output voltage, the input voltage or the $I_{SENSE}$. The output of the DAC 832 is input to a multiplexer 922 to select either the output of the DAC 832 or a reference voltage.

Figure 10:
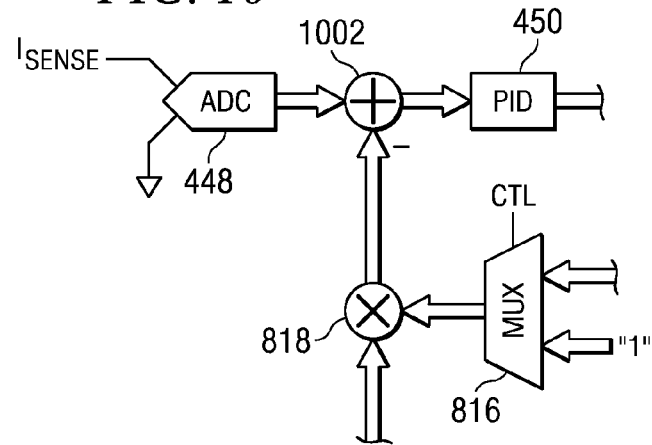
FIG. 10 illustrates an alternate embodiment of the embodiment of FIG. 10.

Referring now to FIG. 10, there is illustrated an embodiment of FIG. 8 wherein the system utilizes a fully digital loop wherein the digital output of the multiplier 818 is input to a negative input of a summing junction 1002 in order to subtract the output thereof from the output of the ADC 448, wherein the reference input to the ADC 448 is referenced to ground. In essence, this basically provides a fully digital solution without the requirement for the DAC 832. However, it works substantially the same.

Figure 11:
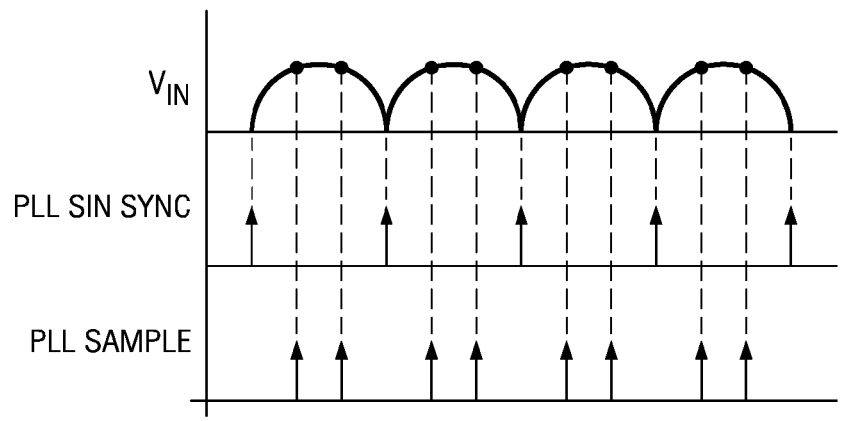
FIG. 11 illustrates a timing diagram for the received input voltage and the sample time.

Referring now to FIG. 11, there are illustrated wave forms for the PFC operations. The input wave form is illustrated as a half sinusoid or full wave rectified signal. The PLL sine sync signal provides pulses that occur every half cycle of the input sinusoid, i.e., at the null or zero crossing of the original $V_{IN}$. These indicate the start of the half sinusoid. Thereafter, there are generated, as noted hereinabove, a plurality of discrete outputs from the PLL for a given half sinusoid, there being potentially, (or example, 256 separate potential selections (or less). The interlace logic will select for any half sinusoid one or more at predetermined increments from the beginning thereof. These are illustrated four half sinusoids wherein there are provided two samples for each half sinusoid at substantially the same location. As will be described hereinbelow, these will be "stepped" across the sinusoid, such that each half sinusoid increments the sample point or adjacent ones are averaged and then it is stepped across. In any event, it can be seen that the sample points for any given half sinusoid are less than the maximum potential number of samples, such that the ADC 810 can be operated at a much lower sampling rate. Therefore, at each PLL selected sampling output by the interlace sequencing logic block 812, the ADC 810 will be initiated and a data conversion cycle will be executed. At the end of the data conversion cycle, a digital output will be provided. Although the sampling rate of the ADC 810 is much higher than the frequency of the potential samples, this ADC only has to be associated with this operation for a short period of time. Actually, in the microcontroller system noted hereinabove, this ADC could be utilized for other functions such as sensing operations, etc.

Figure 12A:
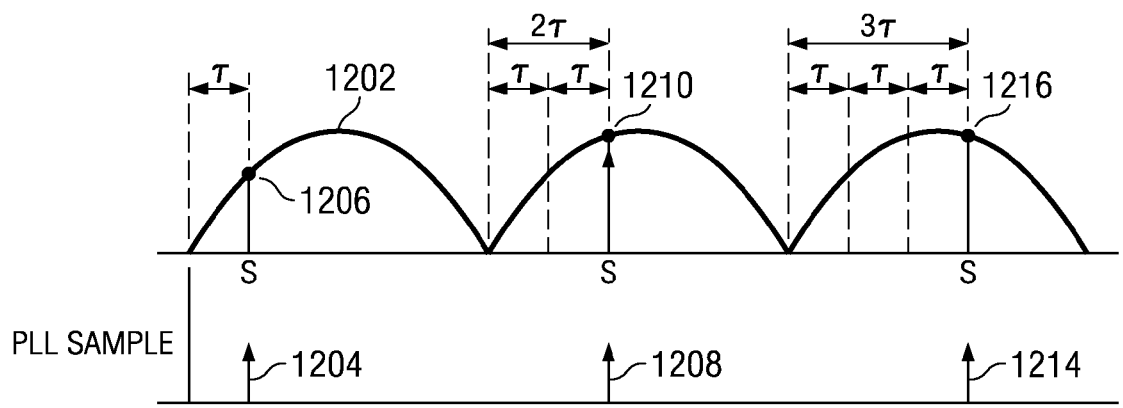
FIGS. 12a and 12b illustrate the sampling operation for generating the harmonic table.
Figure 12B:
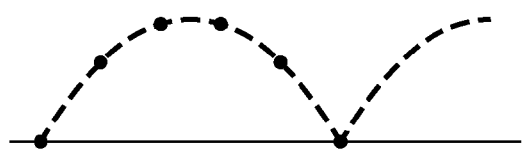

Referring now to FIGS. 12a and 12b, there is illustrated more detail of how the sequencing logic builds the harmonic table. There is illustrated on a first sinusoid 1202 in FIG. 12a a first PLL sample pulse that is selected, this being a pulse 1204. This results in a sample being taken at a point 1206 from the beginning of the half sinusoid. This is referred to as a time τ. At the next half sinusoid, what happens is that a different PLL sample 1208 is selected that is 2τ from the beginning of the half sinusoid. This is at a sample point 1210. At the next half sinusoid, the logic increments is by another increment τ such that a sample pulse 1214 from the PLL output is selected to result in a sample 1216 being taken of that half sinusoid a distance of 3τ from the beginning thereof.

Alternatively, the point 1206 could be averaged over multiple adjacent half sinusoids and then the next incremental step taken in the "stepping" procedure. This would provide an average for that particular sample value. Of course, this would take longer to build the harmonic table. FIG. 12b illustrates the resulting harmonic content of the half sinusoid in the harmonic table. It is then only necessary to output the particular averaged sample over the half sinusoid. It should be understood that less samples than the entire set of samples can be taken and then the samples in between interpolated. It is only necessary to initiate the stored harmonics of the half sinusoid to represent the harmonic content of the average of multiple sequential sinusoids. The reason that this is operable is that the harmonic content does not change that rapidly.

In general, the operation is, upon initiation of the system where there is no content in the harmonic table, to build that harmonic table. If it is determined that 256 samples are required to accurately capture the harmonic content, then it is necessary to provide a stepping function that goes through 256 sequential half sinusoids to select one point therein. Of course, there could be a sampling operation where two or more points were taken in each half sinusoid. In any event, it is necessary to collect a plurality of discrete samples for the overall sinusoid. When the number of samples necessary to represent the harmonics of the single sinusoid averaged or taken over a plurality of sequential half sinusoids is complete, this will constitute a complete harmonic table. The system can then be switched such that the multiplexer 816 is switched from the value of "1" to select the output of a harmonic table. At this point, the system, recognizing where the start of a half sinusoid is, will output and hold digital values for each sample that is stored in the harmonic table 814. This harmonic table 814 could be maintained and updated on occasion. The update process could be, for example, updated by switching back to a "1" value and then rebuilding the table. However, the alternative would be to basically create a new and separate harmonic table and then switch tables such that a harmonic table is continually being created. If this were the case, the first harmonic table would be created in 256 sequential half sinusoids or in 128 cycles of the input signal, assuming that 256 samples were required and only one sample were taken for each half sinusoid, or two samples for each cycle of the input signal. For that condition, it would take 128 cycles of the input signal to create a harmonic table. Upon initialization, this would be the first harmonic table that was created. During the next 128 cycles of the input signal, a second harmonic table could be created, while the first harmonic table 814 is utilized to generate the reference to the ADC 448. At the end of that next 128 cycles of the input signal, the tables could be "flipped." Of course, as noted hereinabove, less than 256 cycles or samples could be utilized for each half sinusoid and, therefore, the table could be updated with less samples.

Figure 13:
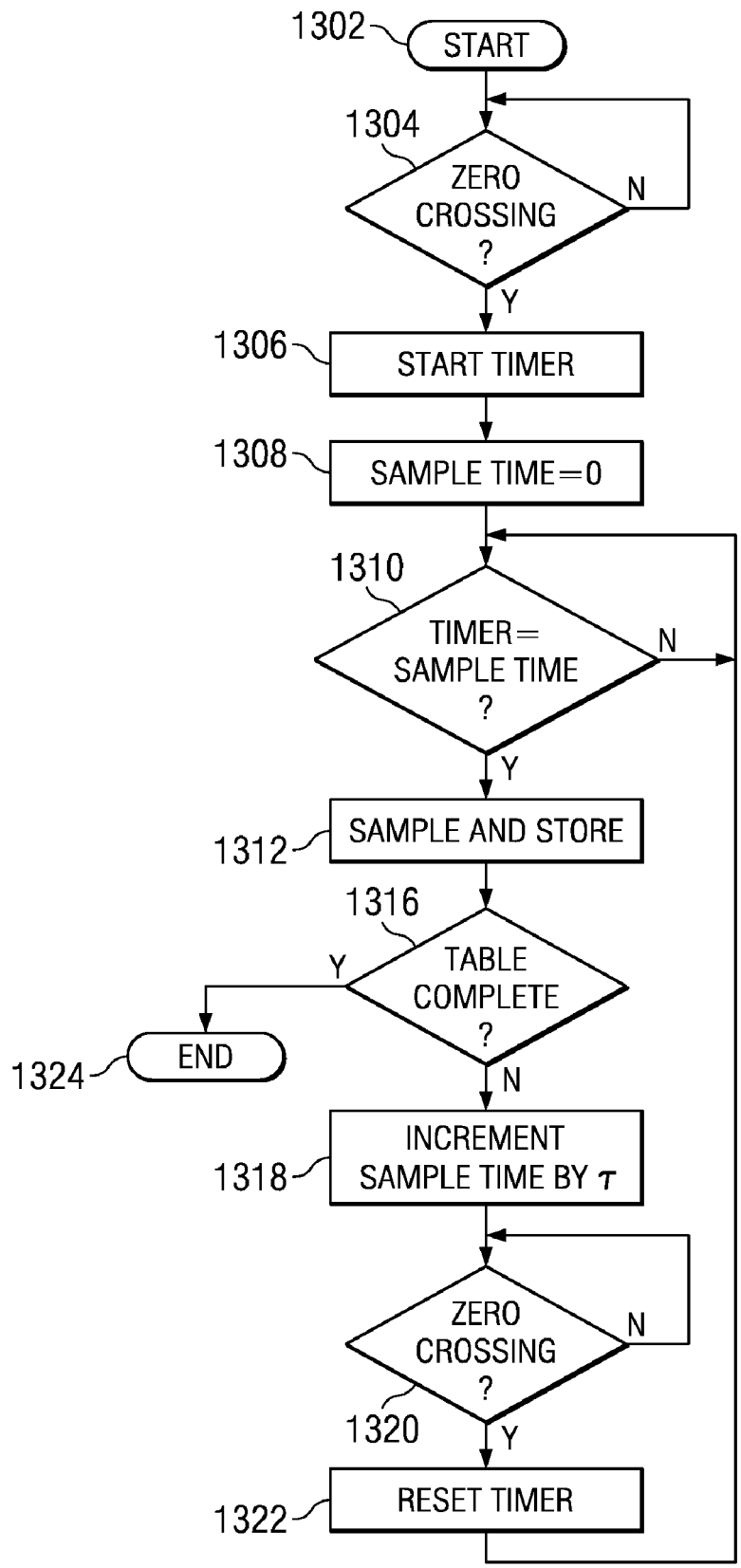
FIG. 13 illustrates a flow chart for the sample operation.

Referring now to FIG. 13, there is illustrated a flow chart for the operation of the sequencing logic. This is initiated at a block 1302 and then proceeds to a decision block 1304. This is the initial operation and, during this operation, it is the reverse table that is being built, and the multiplexer 816 will select the digital "1" value. However, as described hereinabove, there may be swapped tables that need to be selected between. When the initial table is built, it must start at an initial zero crossing. When this initial zero crossing occurs, the program flows along a "Y" path to a function block 1306 to start an internal timer. Then the program flows to a function block 1308 to set the sample time to "0" for the first sample. It could be, as described hereinabove, that for each sinusoid, two samples are taken, each separated by one-half the total samples for a given sinusoid. Therefore, the two samples could be taken at a difference of 128 PLL increments for a total of 256 increments for a given sinusoid. Thus, for sample "0," the sample will be taken at the zero crossing and at the center of this half sinusoid. When the sample is delayed to sample 128, both sample 128 and sample 256 will be taken for each sinusoid. The program then flows to a decision block 1310 to determine if the value of the time is equal to the sample time. If so, then the program flows along a "Y" path to a function block 1312 to sample and store the value. This block 1312 represents both the sample at the sample time and also the sample time plus the delta value in a multiple sample operation as described hereinabove. Therefore, for each half sinusoid and the sample time stored in the sample time register (an internal register), all samples that are associated with a particular half sinusoid will be taken. It should be understood that if multiple samples are taken, the first sample will be taken at the stored sample time, the second sample will be taken at the sample time plus an offset. After the sample(s) have been stored in the memory associated with the table being built, the program flows to a decision block 1316 to determine if the table has been complete, i.e., the last sample has been taken. This will be an operation wherein the value of the sample time is compared to the max sample time. However, if the table has not been completed, the program flows along an "N" path to a function block 1318 to increment the sample time by a value of τ and then the program flows to a decision block 1320 in order to determine if the next zero crossing has been reached, i.e., the next half sinusoid has begun. At this point, the timer will be reset, as indicated by a reset timer block 1322 and then the program proceeds to the decision block 1310 to again determine if the timer value is equal to that of the sample time with the new incremented value. This will continue until all of the samples have been taken, at which time the program will flow from the decision block 1316 to an End block 1324.

Figure 14:
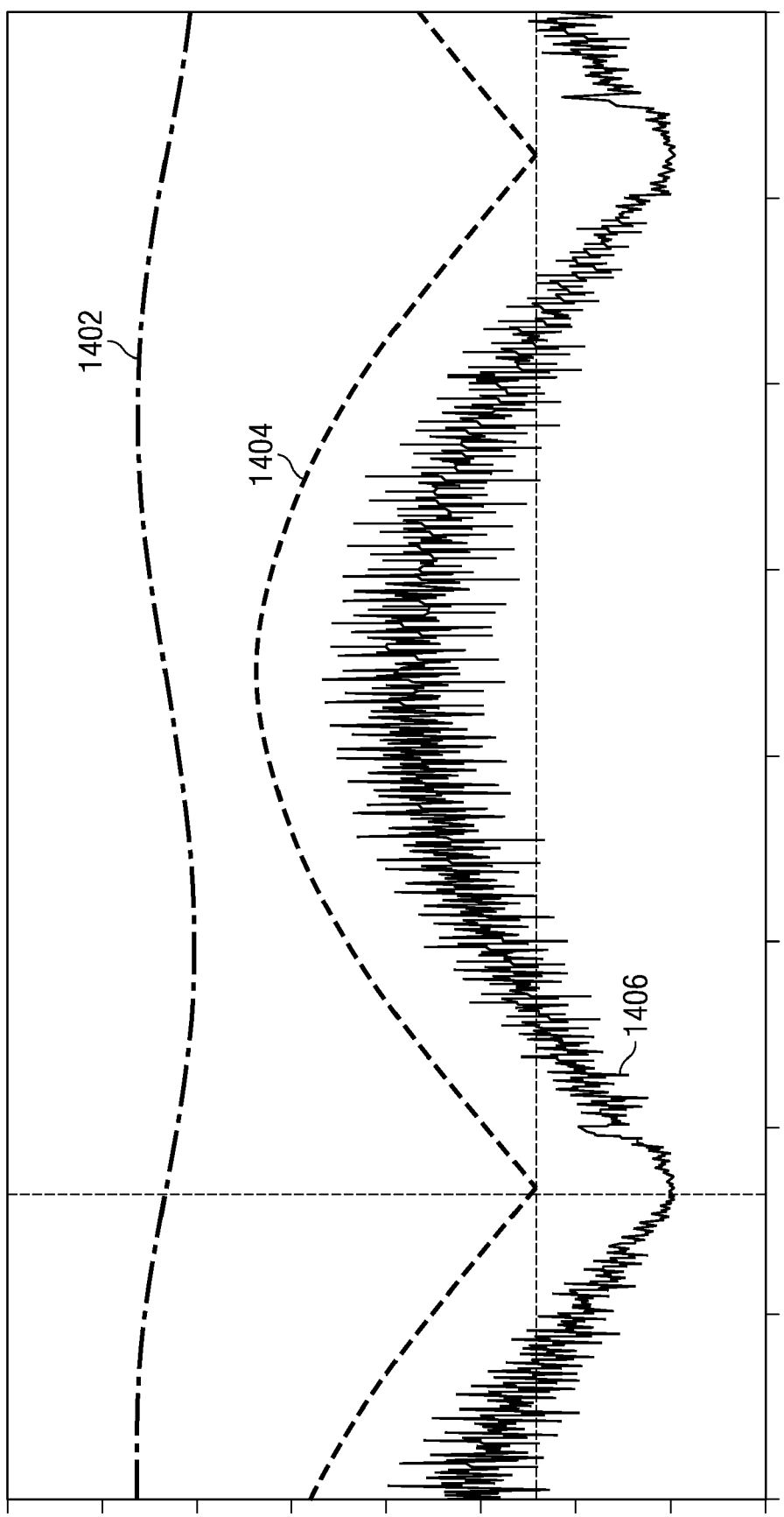
FIGS. 14-16 illustrate wave forms for the current, input voltage and output voltage of the boost converter.

Referring now to FIG. 14, there are illustrated waveforms depicting the output boost voltage on a wave form 1402, the input voltage on a wave form 1404 and the current output on a wave form 1406. The current wave form illustrates the switching noise that is associated therewith. In this condition, it can be seen that the harmonics and the phase for the input voltage and the input current are aligned, i.e., the condition that provides optimized power factor correction.

Figure 15:
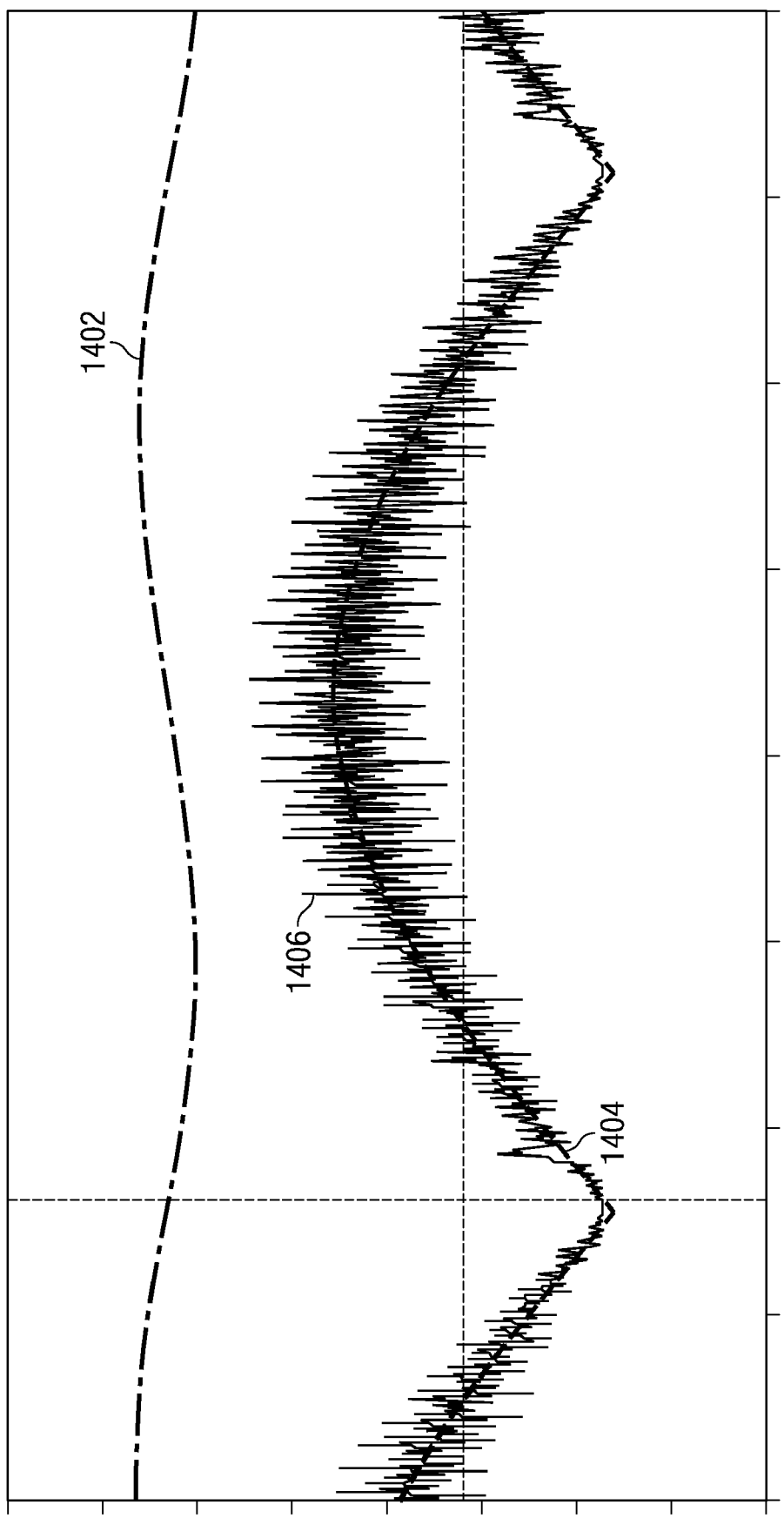

With reference to FIG. 15, the same plot is illustrated with the exception that the input voltage and the output sensed current on wave form 1406 overlap each other.

Figure 16:
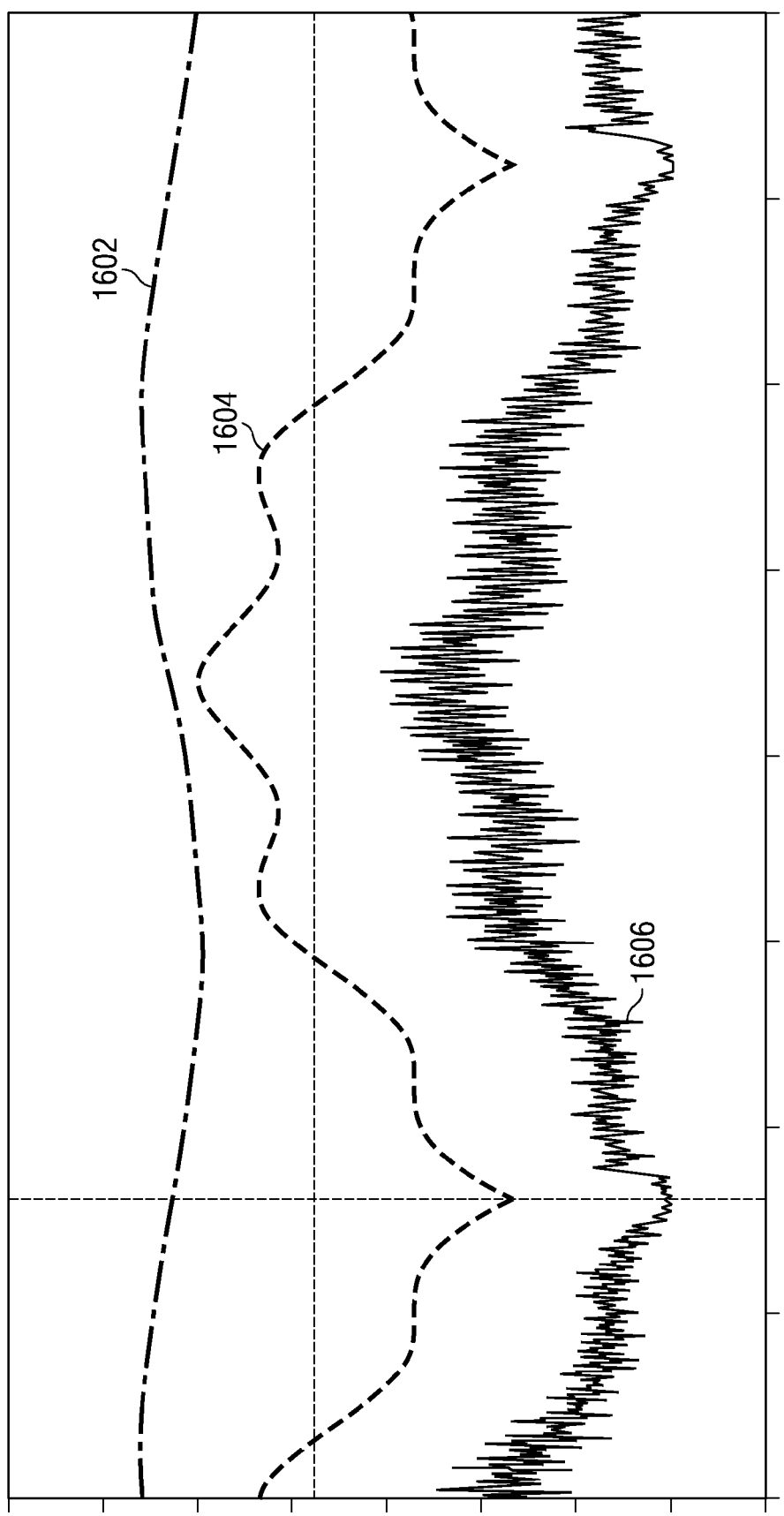

With reference to FIG. 16, the input voltage is represented with the wave form 1604 and the voltage is represented with the wave form 1602. However, the input voltage wave form is illustrated with the fifth harmonic distortion. Thus, it can be seen that it is not a pure sinusoid. The input current is represented by a wave form 1606. It can be seen that the input current is both in phase with the input voltage and it also has a magnitude that tracks the harmonic content of the input voltage. As noted hereinabove, the method for doing this is to create the sensed current with the harmonics of the input voltage wave form embedded therein and then utilize this as the reference control input for the ADC 448. This will utilize the high speed controller 802 to control the magnetics 704.

In summary, it can be seen that the overall operation is to utilize a digital system that provides a first digital control loop that has a high enough bandwidth to adequately provide control for the output boosted voltage compared to an input voltage on a boost converter. By sensing the input current in a PFC control operation, it is only necessary to ensure that the sensed current tracks the input voltage. Further, the tracking is facilitated such that there is a scaler provided on the reference to which it is controlled, this scaler being the output voltage. Therefore, this attains both voltage regulation and power factor correction. This voltage regulation operation, that which determines the average value of the output voltage, is facilitated with a low bandwidth loop. Further, the current tracking operation is facilitated with another and second low bandwidth or low speed loop. This basically creates a harmonic table which can be utilized to create the tracking. The reason for this is that it is recognized the harmonics of an input signal do not change. This allows low bandwidth processes to be digitally emulated for providing a reference to which a high speed digital control loop can be referenced.

In operation, this is an average current mode control loop [where the output voltage is controlled as a function of the output voltage, The output voltage is compared to a reference voltage and the input current controlled to achieve the desired voltage. Thus, the blocks 802 and 822 provide this current mode control. The block 808 generates a second control signal for correcting the relationship between the input current and the input voltage to correct for the power factor. This is achieved by generating a signal that is basically shaped like the input signal and mixing this with the reference error current control signal output by the block 822. This signal represents the harmonics of the input signal and tracks the input signal, a higher bandwidth signal as compared to bandwidth of the signal output by the block 822. This power facto control sacrifices the control of the output voltage to some extent, but this is within an acceptable range.

What is claimed is:

1. A power factor correction circuit (PFC), comprising:
   an analog-to-digital converter;
   a digital compensator connected to the output of the analog-to-digital converter;
   a pulse width modulation circuit for generating a switching pulse connected to the output of the digital compensator;
   a differential analog-to-digital converter having an input on one side thereof connected to a sensed loop current in a regulator circuit and an input on the other side thereof connected to a digital reference;
   wherein the digital reference is derived from receiving an input AC voltage to the regulator circuit and a DC output voltage therefrom and processing these two voltages with a PFC algorithm to provide this digital reference.

2. A DC/DC boost converter for converting a received input DC voltage to a boosted DC output voltage, comprising:
   a voltage conversion circuit operable for converting the input DC voltage to the boosted DC output voltage;
   a current sensor for sensing the DC input current; and
   a digital control loop for a receiving the sensed DC input current, the input voltage and the output voltage and controlling the voltage conversion circuit to achieve a desired value for the boosted DC output voltage and for controlling the input current to correct the power factor, said digital control loop having:
      a high bandwidth control loop for receiving the sensed input current and a current control reference signal for controlling the input current, and
      a low bandwidth control loop for receiving as inputs at least the input DC voltage and the boosted DC output voltage and generating the current control reference signal, the current control reference signal representing a current error value as a function of the error between a desired DC output voltage and the measured boosted DC output voltage, mixed with a time varying error signal that represents the harmonics of the input voltage.

3. The converter of claim 2, wherein said low bandwidth control loop comprises an instruction based microcontroller executing code to realize the functionality thereof.

4. The converter of claim 2, wherein said high bandwidth control loop comprises a hardware digital controller.

5. The converter of claim 4, wherein said voltage conversion circuit comprises a pulse width controlled boost converter and said hardware digital controller comprises:

an analog-to-digital converter for receiving said sensed current and said current control reference signal and generating a digital representation of the difference therebetween as a control signal;
a digital compensator for compensating the control signal; and
a digital pulse width modulator for generating control pulses for controlling said pulse width controlled boost converter.

6. The converter of claim 2, wherein said low bandwidth control loop comprises:
a first feedback loop for receiving as an input the boosted DC output voltage and generating an error signal representing the difference between the measured boosted DC output voltage and a desired DC output voltage;
a second feedback loop for receiving the input voltage and determining a prediction of the harmonics associated therewith; and
a multiplier for mixing the error signal with the predicted harmonics of the input voltage as the control reference signal.

7. The converter of claim 6, wherein said second feedback loop comprises:
a low bandwidth sampling circuit for sampling select points in the input voltage over time and generating a representation of the voltage level over a portion of one cycle of the input signal as a collection of samples;
a memory for storing said collection of samples; and
an output circuit for outputting said collection of samples in synchronization with the input voltage signal to said multiplier, such that the sampling rate of said samples is taken over a longer duration of time that the output thereof.

8. An average current mode control DC/DC boost converter for converting a received input DC voltage to a boosted DC output voltage with power factor correction, comprising:
a voltage conversion circuit operable for converting the input DC voltage to the boosted DC output voltage;
a current sensor for sensing the DC input current;
a digital control loop for a receiving the sensed DC input current and a current reference error signal and controlling the voltage conversion circuit to vary the input current thereto to achieve a desired value for the boosted DC output voltage in an average current mode control;
a reference error signal generator for generating said current reference error signal as a function of the error between a desired output voltage and the actual boosted DC output voltage, said reference error signal generator operating at a low bandwidth relative to said digital control loop;
a harmonic generator for generating a harmonic signal that tracks the harmonics of the input signal; and
a mixer for mixing the output of said harmonic generator with the output of said reference error signal generator to cause the input current to track the harmonics of the input voltage, thus correcting the power factor.

9. The converter of claim 8, wherein said reference error signal generator, said harmonic generator and said mixer comprise an instruction based microcontroller executing code to realize the functionality thereof.

10. The converter of claim 9, wherein said digital control loop comprises a hardware digital controller.

11. The converter of claim 10, wherein said voltage conversion circuit comprises a pulse width controlled boost converter and said hardware digital controller comprises:
an analog-to-digital converter for receiving said sensed current and said current reference error signal and generating a digital representation of the difference therebetween as a control signal;
a digital compensator for compensating the control signal; and
a digital width modulator for generating control pulses for controlling said pulse width controlled boost converter.

12. The converter of claim 8, wherein:
said reference error signal generator comprises a first feedback loop for receiving as an input the boosted DC output voltage and generating an error signal representing the difference between the measured boosted DC output voltage and a desired DC output voltage as said current reference error signal;
said harmonic generator comprises a second feedback loop for receiving the input voltage and determining a prediction of the harmonics associated therewith;
aid mixer for mixing the current error reference signal with the predicted harmonics of the input voltage for input to said digital control loop.

13. The converter of claim 12, wherein said second feedback loop comprises:
a low bandwidth sampling circuit for sampling select points in the input voltage over time and generating a representation of the voltage level over a portion of one cycle of the input signal as a collection of samples;
a memory for storing said collection of samples; and
an output circuit for outputting said collection of samples in synchronization with the input voltage signal to said mixer, such that the sampling rate of said samples is taken over a longer duration of time that the output thereof.

\* \* \* \* \*